(12) United States Patent
Kim et al.

(10) Patent No.: US 9,188,300 B2
(45) Date of Patent: *Nov. 17, 2015

(54) LIGHT EMITTING DEVICE ASSEMBLY AND HEADLAMP INCLUDING THE SAME

(71) Applicant: SAMSUNG ELECTRONICS CO., LTD., Suwon-Si, Gyeonggi-Do (KR)

(72) Inventors: Hee Dong Kim, Gwangmyeong-si (KR); Moo Youn Park, Gwangmyeong-si (KR); Soo Hwan Lee, Daejeon (KR); Hee Seok Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/575,741

(22) Filed: Dec. 18, 2014

(65) Prior Publication Data

US 2015/0103547 A1  Apr. 16, 2015

Related U.S. Application Data

(63) Continuation of application No. 14/151,733, filed on Jan. 9, 2014, now Pat. No. 8,921,883, which is a continuation of application No. 13/475,486, filed on May 18, 2012, now Pat. No. 8,882,319.

(30) Foreign Application Priority Data

May 18, 2011  (KR) .......................... 10-2011-0046845

(51) Int. Cl.
*F21S 8/10* (2006.01)
*H01L 33/46* (2010.01)
(Continued)

(52) U.S. Cl.
CPC ........... *F21S 48/1388* (2013.01); *F21S 48/115* (2013.01); *F21S 48/1154* (2013.01);
(Continued)

(58) Field of Classification Search
CPC .. F21S 48/1388; F21S 48/115; F21S 48/1225
See application file for complete search history.

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

CN    1920378 A       2/2007
JP    2004127662 A    4/2004
(Continued)

OTHER PUBLICATIONS

United States Non-Final Office Action issued in U.S. Appl. No. 14/151,733 dated Feb. 24, 2014.
(Continued)

*Primary Examiner* — Elmito Breval
(74) *Attorney, Agent, or Firm* — McDermott Will & Emery LLP

(57) ABSTRACT

An LED assembly according to an embodiment of the present invention may improve dark regions generated between LED chips by employing a first reflective layer between the LED chips. By employing a transparent optical layer or an optical layer including a scattering particle between an LED chip and a phosphor layer, direct contact between the LED chip and the phosphor layer may be avoided, thereby preventing a low light extraction efficiency. Further, by employing a second reflection layer on side surfaces of an to LED chip, an optical layer, and a phosphor layer, a relatively high contrast may be obtained. An LED assembly may enhance contrast through a reflective layer while increasing light extraction efficiency by including a scattering particle in a phosphor layer.

13 Claims, 7 Drawing Sheets

(51) Int. Cl.
*H01L 33/50* (2010.01)
*H01L 33/60* (2010.01)
*H01L 33/44* (2010.01)

(52) U.S. Cl.
CPC ......... *F21S48/1225* (2013.01); *F21S 48/1394* (2013.01); *H01L 33/46* (2013.01); *H01L 33/50* (2013.01); *H01L 33/507* (2013.01); *H01L 33/60* (2013.01); *H01L 33/44* (2013.01)

(56) References Cited

U.S. PATENT DOCUMENTS

| | | | |
|---|---|---|---|
| RE38,466 E | | 3/2004 | Inoue et al. |
| 6,818,465 B2 | | 11/2004 | Biwa et al. |
| 6,818,530 B2 | | 11/2004 | Shimoda et al. |
| 6,858,081 B2 | | 2/2005 | Biwa et al. |
| 6,917,057 B2 | | 7/2005 | Stokes et al. |
| 6,967,353 B2 | | 11/2005 | Suzuki et al. |
| 7,002,182 B2 | | 2/2006 | Okuyama et al. |
| 7,084,420 B2 | | 8/2006 | Kim et al. |
| 7,087,932 B2 | | 8/2006 | Okuyama et al. |
| 7,154,124 B2 | | 12/2006 | Han et al. |
| 7,208,725 B2 | | 4/2007 | Sherrer et al. |
| 7,288,758 B2 | | 10/2007 | Sherrer et al. |
| 7,319,044 B2 | | 1/2008 | Han et al. |
| 7,501,656 B2 | | 3/2009 | Han et al. |
| 7,517,728 B2 | | 4/2009 | Leung et al. |
| 7,709,857 B2 | | 5/2010 | Kim et al. |
| 7,759,140 B2 | | 7/2010 | Lee et al. |
| 7,781,727 B2 | | 8/2010 | Sherrer et al. |
| 7,790,482 B2 | | 9/2010 | Han et al. |
| 7,799,586 B2 | | 9/2010 | Leung et al. |
| 7,940,350 B2 | | 5/2011 | Jeong |
| 7,959,312 B2 | | 6/2011 | Yoo et al. |
| 7,964,881 B2 | | 6/2011 | Choi et al. |
| 7,985,976 B2 | | 7/2011 | Choi et al. |
| 7,994,525 B2 | | 8/2011 | Lee et al. |
| 8,008,683 B2 | | 8/2011 | Choi et al. |
| 8,013,352 B2 | | 9/2011 | Lee et al. |
| 8,049,161 B2 | | 11/2011 | Sherrer et al. |
| 8,129,711 B2 | | 3/2012 | Kang et al. |
| 8,179,938 B2 | | 5/2012 | Kim |
| 8,263,987 B2 | | 9/2012 | Choi et al. |
| 8,324,646 B2 | | 12/2012 | Lee et al. |
| 8,399,944 B2 | | 3/2013 | Kwak et al. |
| 8,432,511 B2 | | 4/2013 | Jeong |
| 8,459,832 B2 | | 6/2013 | Kim |
| 8,502,242 B2 | | 8/2013 | Kim |
| 8,536,604 B2 | | 9/2013 | Kwak et al. |
| 8,735,931 B2 | | 5/2014 | Han et al. |
| 8,766,295 B2 | | 7/2014 | Kim |
| 2002/0021085 A1 | | 2/2002 | Ng |
| 2003/0201451 A1 | | 10/2003 | Suehiro et al. |
| 2006/0034084 A1 | | 2/2006 | Matsuura et al. |
| 2007/0047250 A1 | | 3/2007 | Kinoshita |
| 2009/0184333 A1 | | 7/2009 | Wang et al. |
| 2011/0279304 A1 | | 11/2011 | Yonemoto et al. |

FOREIGN PATENT DOCUMENTS

| | | |
|---|---|---|
| KR | 10-2009-0109524 A | 10/2009 |
| TW | 200618339 A | 6/2006 |
| TW | 200620694 A | 6/2006 |
| TW | M309750 U | 4/2007 |
| TW | M334470 U | 6/2008 |
| TW | M397595 U | 2/2011 |

OTHER PUBLICATIONS

Notice of Allowance issued in U.S. Appl. No. 13/475,486 dated Sep. 23, 2014.
United States Office Action issued in U.S. Appl. No. 13/475,486 dated Mar. 3, 2014.
United States Office Action issued in U.S. Appl. No. 13/475,486 dated Oct. 10, 2013.
United States Office Action issued in U.S. Appl. No. 13/475,486 dated Apr. 29, 2013.
Taiwanese Office Action dated Aug. 21, 2014 issued in Application No. 101116805.
Notice of Allowance issued in U.S. Appl. No. 14/151,733 dated Nov. 20, 2014.

100

LIGHT EMITTING DEVICE ASSEMBLY AND HEADLAMP INCLUDING THE SAME

CROSS-REFERENCE TO RELATED APPLICATION

This application is a continuation of U.S. application Ser. No. 14/151,733, filed Jan. 9, 2014, which claims the benefit of U.S. patent application Ser. No. 13/475,486, filed on May 18, 2012, now U.S. Pat. No. 8,882,319, which in turn claims the benefit of Korean Patent Application No. 10-2011-0046845, filed on May 18, 2011, in the Korean Intellectual Property Office, the disclosures of each Application is incorporated herein by reference.

BACKGROUND

1. Field of the Invention

The present invention relates to a light emitting device (LED) assembly and a headlamp including the LED assembly, and more particularly, to an LED assembly and a headlamp including the LED assembly that may obtain high contrast while reducing a loss of light emitted from an LED.

2. Description of the Related Art

In general, a vehicle may incorporate a lamp system such as a headlamp and a tail lamp to recognize an object in a traveling direction while travelling at night and to inform other vehicles or other load users about a travel state of the vehicle. The headlamp may be referred to as a headlight, and indicate a lighting lamp that lights a path along which the vehicle travels. A daytime running light (DRL) may indicate a lamp enhancing perception of a vehicle during daytime hours to reduce a risk of accidents occurring.

An existing lamp for a vehicle may generally have a headlamp manufactured using a light source such as a halogen lamp, a high intensity discharge (HID), and the like. Here, an emitting pattern of the headlight is regulated, and an optical design or a physical shield cutoff of the headlight is used to conform to the regulation.

A light emitting device (LED) may correspond to a semiconductor device that generates light by an applied current. The LED may be superior to other light sources in terms of low power consumption, semi-permanent lifespan, fast response time, high light conversion efficiency, stability, environmental friendliness, and the like. Thus, a headlamp using an LED as a light source of a lamp for a vehicle has been developed recently. However, an LED headlamp used for a vehicle is in a first stage of development, and is being developed slowly.

A light collection structure of a conventional LED headlamp may include an LED light source, a reflector to control a direction of light generated by the LED headlamp, a lens to protect the LED light source, and a physical shield capable of blocking light emitted toward a vehicle from an opposite direction and to prevent a glare from the opposite direction affecting the vehicle.

As described in the foregoing, a light intensity may decrease when a cutoff shield is used to conform to regulations for an emitting pattern of a vehicle headlamp. Thus, an LED headlamp excluding the cutoff shield is being developed at an increased rate.

In a structure excluding the cutoff shield, a light emitted from a light source may disperse and as such, it may be difficult to obtain a desired contrast. In particular, to obtain a high contrast, light generated from an LED chip and being dispersed to a side of the LED chip may be blocked. Here, light extraction efficiency may be an essential element in the LED light source. Thus, contrast of an LED light source and the light extraction efficiency may be in a trade-off relationship.

Accordingly, there is a desired for a structure for enhancing contrast of an LED light source while preventing a decrease in light extraction efficiency.

SUMMARY

According to an aspect of the present invention, there is provided a light emitting device (LED) assembly and a headlamp including the LED assembly that may obtain a high contrast while reducing loss of light emitted from an LED.

According to another aspect of the present invention, there is provided an LED assembly including a substrate, at least one LED chip mounted on the substrate, a first reflection layer formed on a side surface of the at least one LED chip, an optical layer formed on the at least one LED chip, a phosphor layer formed on the optical layer, and a second reflection layer formed on side surfaces of the optical layer and the phosphor layer.

The optical layer may be formed using a transparent material.

The optical layer may be formed using silicone.

The optical layer may include a scattering particle.

The scattering particle may correspond to silicon dioxide ($SiO_2$).

An upper surface of the optical layer may be patterned.

The first reflection layer and the second reflection layer may be formed using the same material.

The first reflection layer and the second reflection layer may comprise a material selected from a group consisting of titanium dioxide ($TiO_2$), zirconium dioxide ($ZrO_2$), niobium pentoxide ($Nb_2O_5$), aluminum oxide ($Al_2O_3$), magnesium fluoride ($MgF_2$), aluminum nitride (AlN), and silicon dioxide ($SiO_2$).

The optical layer and the phosphor layer may be formed in a film form and be mounted on the at least one LED chip.

According to still another aspect of the present invention, there is provided an LED assembly including a substrate, at least one LED chip mounted on the substrate, a first reflection layer formed on a side surface of the at least one LED chip, a phosphor layer formed on the at least one LED chip and comprising a scattering particle, and a second reflection layer formed on a side surface of the phosphor layer.

The scattering particle may correspond to $SiO_2$.

An upper surface of the phosphor layer may be patterned.

The first reflection layer and the second reflection layer may include a material selected from $TiO_2$, $ZrO_2$, $Nb_2O_5$, $Al_2O_3$, $MgF_2$, AlN, and $SiO_2$.

The phosphor layer may be formed in a film form and be mounted on the at least one LED chip.

According to yet another aspect of the present invention, there is provided a headlamp for a vehicle including one of the LED assemblies described above, a reflector to reflect a light generated by the LED assembly at the front of the vehicle, and a lens to project a light reflected by the reflector and emitted to an area in front of the vehicle of the vehicle.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
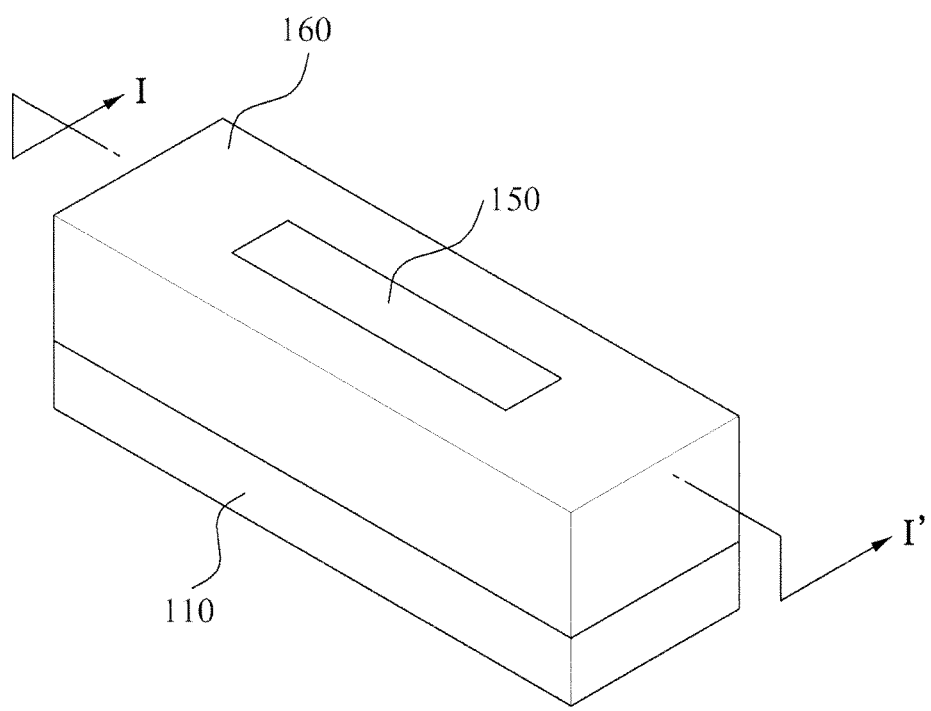
FIG. 1 is a perspective view illustrating a light emitting device (LED) assembly according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Throughout the specifications, when it is described that each of a substrate, a layer, an element, and the like is formed "on" or "under" a substrate, a layer, an element, and the like, the term "on" may include "directly on" and "indirectly on interposing another element therebetween," and the term "under" may include "directly under" and "indirectly under interposing another element therebetween." A standard for "on" or "under" of each element may be determined based on a corresponding drawing.

Sizes of elements in drawings may be exaggerated for ease of descriptions, and do not indicate real sizes.

Hereinafter, a light emitting device (LED) assembly and a headlamp including the LED assembly according to embodiments will be described with reference to drawings.

Figure 2:
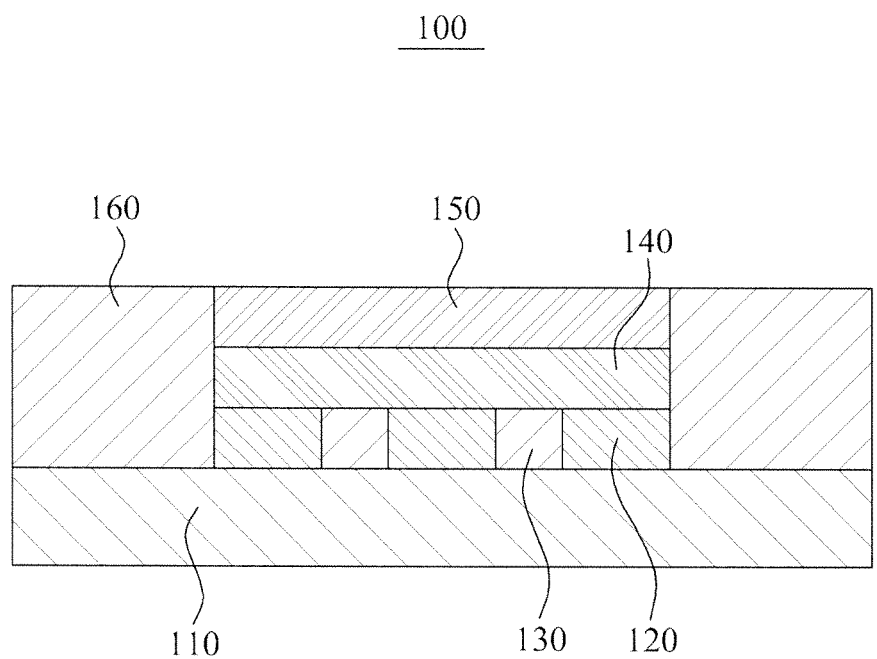
FIG. 2 is a cross-sectional view cut along the line I-I' of FIG. 1.

FIG. 1 is a perspective view illustrating a light emitting device (LED) assembly according to an embodiment of the present invention. FIG. 2 is a cross-sectional view cut along the line I-I' of FIG. 1.

Referring to FIG. 1 and FIG. 2, the LED assembly 100 according to an aspect of an embodiment may include a substrate 110, at least one LED chip 120 mounted on the substrate 110, a first reflection layer 130 formed on a side surface of the at least one LED chip 120, an optical layer 140 formed on the at least one LED chip 120, a phosphor layer 150 formed on the optical layer 140, and a second reflection layer 160 formed on side surfaces of the optical layer 140 and the phosphor layer 150.

The substrate 110 may be manufactured using a metal, silicon, or ceramic. Here, the substrate 110 may correspond to an insulating substrate manufactured using glass or sapphire, and correspond to a conductive substrate manufactured using silicon (Si), silicon carbide (SiC), or zinc oxide (ZnO). That is, the substrate 110 may be manufactured using a material having an excellent heat radiation characteristic. An electrode (not shown) may be formed on the substrate 110, and the electrode may include an electric circuit. Here, power may be supplied to the at least one LED chip 120 through the electric circuit.

The at least one LED chip 120 used as a light source may be mounted on the substrate 110.

The at least one LED chip 120 is briefly described in the following. The at least one LED chip 120 may include a first conductive semiconductor layer, an active layer, a second conductive semiconductor layer, and an electrode. Here, the first conductive semiconductor layer may be n-doped. That is, an electron may be moved to the active layer through the first conductive semiconductor layer.

The active layer may be formed on the first conductive semiconductor layer. For example, the active layer may be formed in a laminated structure in which a quantum barrier layer and a quantum well layer are alternately formed so that an electron and a hole may recombine and emit light. In this instance, composition of the active layer may vary depending on a desired emission wavelength.

The second conductive semiconductor layer may be formed on the active layer. Here, the second conductive semiconductor layer may be p-doped. That is, a hole may be moved to the active layer through the second conductive semiconductor layer.

A transparent electrode may be formed on the second conductive semiconductor layer. As an example, the transparent electrode may be formed on a transparent metal layer such as nickel (Ni)/gold (Au) or be formed to include a conductive oxide such as indium tin oxide (ITO). Here, a p-type electrode may be formed on the transparent electrode, and an n-type electrode may be formed on the first conductive semiconductor layer. In this instance, the p-type electrode and the n-type electrode may include various conductive materials such as titanium (Ti)/aluminum (Al), and the like.

A hole may be provided through the p-type electrode, and an electron may be provided through the n-type electrode. The provided hole and the electron may combine in the active layer to generate light energy. The at least one LED chip 120 may correspond to an ultraviolet LED or a blue light LED depending on a desired wavelength of an emitted light.

The first reflection layer 130 may be formed on a side surface of the at least one LED chip 120. The first reflection layer 130 may be formed between the at least one LED chip 120. The first reflection layer 130 may be formed to improve dark regions generated in a space between LED chips when there exists a plurality of LED chips 120. The first reflection layer 130 may fill in the space between the at least one LED chip 120, thereby improving dark regions where luminance deteriorates in comparison to each portion of the at least one LED chip 120.

The first reflection layer 130 may reflect light emitted from a side of the at least one LED chip 120 to be delivered to the optical layer 140.

The optical layer 140 may be formed on the at least one LED chip 120. The optical layer 140 may be formed on the first reflection layer 130 that is formed between the LED chips when there exists a plurality of LED chips 120. In this instance, the optical layer 140 may be formed on the entire surface of the plurality of the LED chips 120 rather than being formed on each of the plurality of the LED chips 120 respectively. Thus, light generated on the at least one LED chip 120 and light generated at a side of the at least one LED chip 120 and delivered by the first reflection layer 130 may be delivered to the phosphor layer 150 through the optical layer 140.

The optical layer 140 may function as a light guide panel that delivers light generated from the at least one LED chip 120 to the phosphor layer 150. The optical layer 140 formed using a transparent material may be disposed between the at least one LED chip 120 and the phosphor layer 150 to prevent direct contact between the at least one LED chip 120 and the phosphor layer 150, thereby reducing a loss of light.

The optical layer 140 may be formed using a transparent material. For example, the optical layer 140 may be formed using silicone. Here, the optical layer 40 may be formed using a silicone resin having light transmissivity of at least 90%. For example, the optical layer 140 may be formed using at least one material selected from a group consisting of transparent silicone resin composition, epoxy resin, a modified epoxy resin composition, and may not be limited thereto. The optical layer 140 may be formed using a transparent material such as glass or an insulating composition of a plastic synthetic resin.

In an LED assembly according to an aspect of an embodiment of the present invention, the optical layer 140 may include a scattering particle, and the scattering particle may correspond to silicon dioxide ($SiO_2$). When the scattering particle is included in the optical layer 140, light delivered from the at least one LED chip 120 may be scattered, thereby enhancing light extraction efficiency. An upper surface of the optical layer 140 may be patterned. When the upper surface of the optical layer 140 is patterned to have micro-irregularities, an amount of light lost in the optical layer 140 may be reduced, thereby enhancing light extraction efficiency.

The phosphor layer 150 may be formed on the optical layer 140. Here, light emitted from the at least one LED chip 120 may be delivered through the optical layer 140 and emitted to an external environment through the phosphor layer 150.

The phosphor layer 150 may scatter and color-convert colors of light emitted from the at least one LED chip 120. For example, blue light emitted from the at least one LED chip 120 may be converted to yellow light, green light, or red light through the phosphor layer 150 and white light may be emitted to an external environment.

The phosphor layer 150 may include a phosphor material that may convert blue light to yellow light, green light, or red light. In this instance, the phosphor layer 150 may include a host material and an active material, and include, for example, a material activated by cerium (Ce) in an yttrium aluminum garnet (YAG) host material. A material activated by europium (Eu) included in a silicate-based host material may be used for the phosphor layer 150, and not be limited thereto.

The phosphor layer 150 may be formed to have a thin and uniform thickness. That is, phosphor particles may be uniformly distributed in the phosphor layer 150. Thus, colors of light penetrating the phosphor layer 150 may be uniformly color-converted.

Figure 3A:
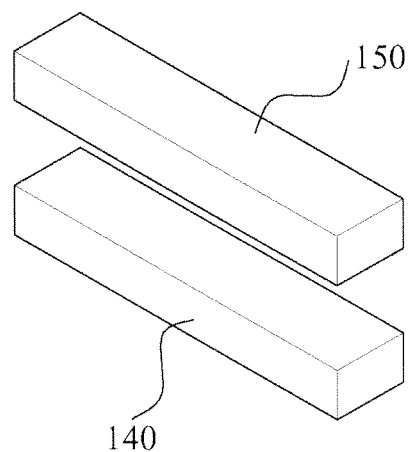
FIGS. 3A and 3B are diagrams illustrating an optical layer and a phosphor layer in a film or in an LED assembly according to another embodiment of the present invention.
Figure 3B:
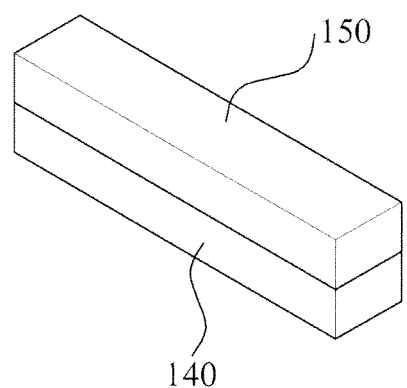

FIGS. 3A and 3B are diagrams illustrating an optical layer 140 and a phosphor layer 150 in a film form in an LED assembly according to another embodiment of the present invention. FIG. 3A illustrates that the optical layer 140 and the phosphor layer 150 are separately manufactured in film forms, and FIG. 3B illustrates that the optical layer 140 and the phosphor layer 150 are manufactured in a film form as one body.

In an LED assembly according to an aspect of an embodiment of the present invention, the optical layer 140 and the phosphor layer 150 may be formed in a film form to be stacked on the at least one LED chip 120 of FIG. 2. Referring to FIG. 3A, the optical layer 140 and the phosphor layer 150 may be manufactured separately in film forms to be subsequently stacked on the at least one LED chip 120. Referring to FIG. 3B, the optical layer 140 and the phosphor layer 150 may be manufactured in a film form as one body to be stacked on the at least one LED chip 120 in a single operation. Thus, a manufacturing process may be simplified by initially manufacturing the optical layer 140 and the phosphor layer 150 in a film form.

The optical layer 140 and the phosphor layer 150 may be formed by applying a liquid material onto the at least one LED chip 120 and a first reflection layer 130 of FIG. 2 and using thermal curing or ultraviolet (UV) curing.

Referring to FIG. 2, the second reflection layer 160 may be formed on side surfaces of the optical layer 140 and the phosphor layer 150 to improve a total luminous flux and obtain contrast in a boundary of a light source portion. That is, when the first reflection layer 130 is formed only between LED chips when there exists a plurality of the at least one LED chip 120, the second reflection layer 160 may be formed on a side surface of the at least one LED chip 120 at an outermost position. The first reflection layer 130 or the second reflection layer 160 may be formed on a side surface of the at least one LED chip 120 at an outermost position.

High contrast of a light source may be obtained by forming a reflection layer on side surfaces of the at least one LED chip 120, the optical layer 140, and the phosphor layer 150. In an LED assembly according to an aspect of an embodiment of the present invention, the first reflection layer 130 and the second reflection layer 160 may be formed using the same material. The first reflection layer 130 and the second reflection layer 160 may be formed using an oxide that includes one of titanium (Ti), zirconium (Zr), niobium (Nb), aluminum (Al), and silicon (Si) corresponding to a light reflective material, or be formed using a material selected from aluminum nitride (AlN) and magnesium fluoride ($MgF_2$). For example, the first reflection layer 130 and the second reflection layer 160 may be formed using a material selected from a group consisting of titanium dioxide ($TiO_2$), zirconium dioxide ($ZrO_2$), niobium pentoxide ($Nb_2O_5$), aluminum oxide ($Al_2O_3$), magnesium fluoride ($MgF_2$), aluminum nitride (AlN), and $SiO_2$.

In an LED assembly according to an aspect of an embodiment of the present invention, contrast may be enhanced by employing the second reflection layer 160 to prevent light from being emitted to an external environment through a portion other than the phosphor layer 150. Since a separate shield structure for enhancing contrast may be omitted, a loss of light may be minimized and light extraction efficiency may be improved.

Although, the configurations may be different from the aforementioned LED assembly, for ease of description, descriptions of structures that are similar to, or the same as the structures described in the foregoing with reference to FIG. 1 and FIG. 2 will be omitted, for conciseness, or will be provided as needed.

Figure 4:
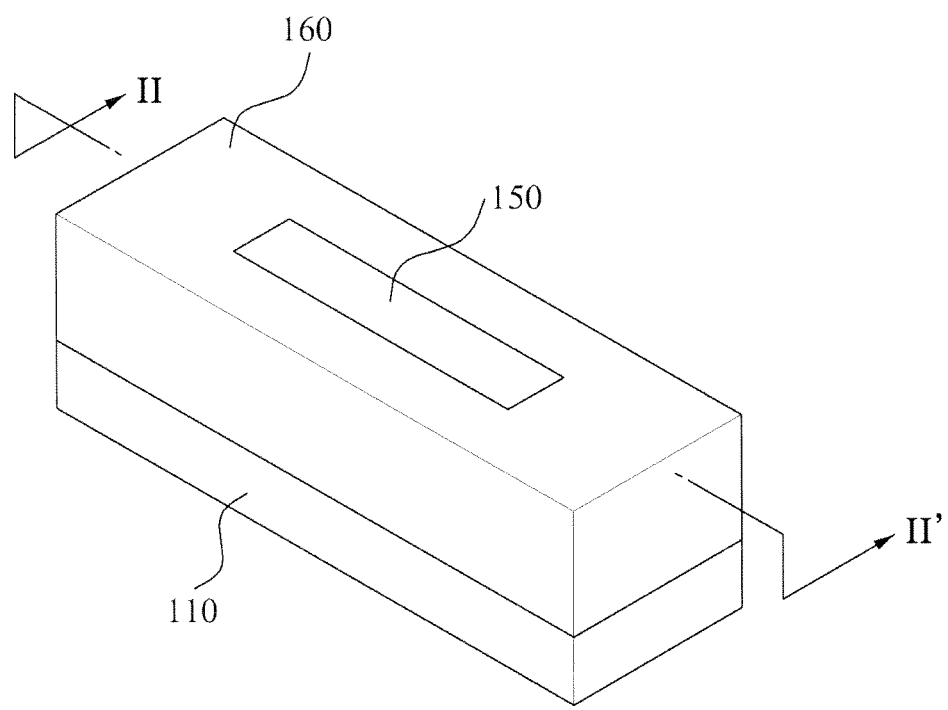
FIG. 4 is a perspective view illustrating an LED assembly according to still another embodiment of the present invention.
Figure 5:
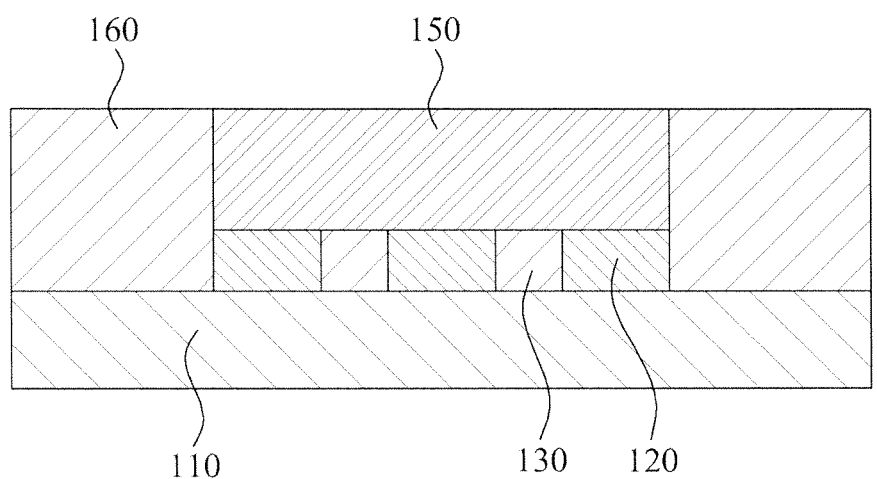
FIG. 5 is a cross-sectional view cut along the line II-II' of FIG. 4.

FIG. 4 is a perspective view illustrating an LED assembly 200 according to still another embodiment of the present invention. FIG. 5 is a cross-sectional view cut along the line II-II' of FIG. 4.

Referring to FIG. 4 and FIG. 5, the LED assembly 200 according to an aspect of an embodiment of the present invention may include a substrate 110, at least one LED chip 120 mounted on the substrate 110, a first reflection layer 130 formed on a side surface of the at least one LED chip 120, a phosphor layer 150 formed on the at least one LED chip 102 and including a scattering particle, and a second reflection layer 160 formed on a side surface of the phosphor layer 150.

The phosphor layer 150 may be directly formed on the at least one LED chip 102 and include the scattering particle. When the phosphor layer 150 contacts the at least one LED chip 102, light extraction efficiency may be lowered due to a relatively large amount of light lost in the LED assembly 200. However, according to the present invention, the scattering particle may be included in the phosphor layer 150 and thus, a low light extraction efficiency may be prevented.

The scattering particle included in the phosphor layer 150 may correspond to $SiO_2$. When the scattering particle may be included in the phosphor layer 150, light delivered from the at least one LED chip 102 may be scattered, thereby enhancing light extraction efficiency. In the LED assembly 200, according to an aspect of an embodiment of the present invention, an upper surface of the phosphor layer 150 may be patterned. In this instance, when the upper surface of the optical layer 150 is patterned to have micro-irregularities, an amount of light amount lost in the LED assembly 200 may be reduced, thereby enhancing light extraction efficiency.

As described in the foregoing, the first reflection layer 130 and the second reflection layer 160 may be formed using an oxide, corresponding to a light reflective material, that includes one of Ti, Zr, Nb, Al, Si or be formed using a material selected from AlN and $MgF_2$. For example, the first reflection layer 130 and the second reflection layer 160 may be formed using a material selected from a group consisting of $TiO_2$, $ZrO_2$, $Nb_2O_5$, $Al_2O_3$, $MgF_2$, AlN, and $SiO_2$.

The phosphor layer 150 including the scattering particle may be manufactured in a film form to be stacked on the at least one LED chip 120. Thus, a manufacturing process may be simplified by initially manufacturing the phosphor layer 150 in a film form, and then stacking the phosphor layer 150 on the at least one LED chip 120.

Figure 6:
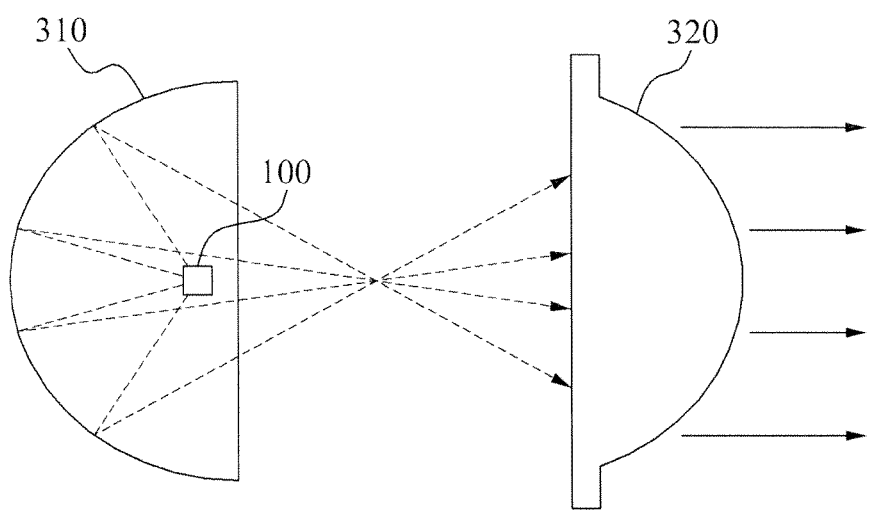
FIG. 6 is a cross-sectional view roughly illustrating a headlamp for a vehicle according to yet another embodiment of the present invention.

FIG. 6 is a cross-sectional view roughly illustrating a headlamp for a vehicle according to yet another embodiment of the present invention.

A headlamp having an LED assembly according to an aspect of an embodiment of the present invention may include the LED assembly 100 described above, a reflector 310, and a lens 320.

The reflector 310 may be incorporated in the headlamp to reflect a light generated by the LED assembly 100 at the front of the vehicle, and be formed in a predetermined shape to reflect the light to an area in front of the vehicle. The reflector 310 may be provided in various structures, forms and shapes such as a parabolic shape, a straight line type, and an optical reflector structure.

The lens 320 may project a light reflected by the reflector 310 and emitted to an area in front of the vehicle of the vehicle. Here, the lens 320 may correspond to an aspheric lens, and may not be limited thereto.

Accordingly, an LED assembly according to an aspect of an embodiment of the present invention may improve dark regions generated between at least one LED chip, may reduce loss of light, and may obtain a relatively high contrast. An LED assembly according to an embodiment of the present invention may omit a shield structure and thus, a headlamp for a vehicle may be manufactured in a relatively simple structure.

An LED assembly according to an embodiment of the present invention may improve dark regions generated between LED chips when there is a plurality of the at least one LED chip 120, by employing a first reflection layer between the LED chips. By employing a transparent optical layer or an optical layer including a scattering particle between an LED chip and a phosphor layer, direct contact between the LED chip and the phosphor layer may be avoided, thereby preventing a low light extraction efficiency. Further, by employing a second reflection layer on side surfaces of an LED chip, an optical layer, and a phosphor layer, a relatively high contrast may be obtained.

An LED assembly according to an aspect of an embodiment of the present invention may enhance contrast through a reflective layer while increasing light extraction efficiency by including a scattering particle in a phosphor layer.

Accordingly, an LED assembly according to an aspect of an embodiment of the present invention may improve dark regions generated between LED chips when there exists a plurality of the at least one LED chip 120, reduce a loss of light, and obtain a relatively high contrast.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A headlamp for a vehicle comprising:
 a light emitting device (LED) assembly;
 a reflector to reflect a light generated by the LED assembly at the front of the vehicle; and
 a lens to project a light reflected by the reflector and emitted to an area in front of the vehicle, wherein the LED assembly comprises:
 at least one LED chip;
 a reflection layer disposed on four lateral surfaces of the at least one LED chip, wherein the reflection layer is in direct physical contact with the four lateral surfaces of the at least one LED chip; and
 a phosphor layer disposed on an upper surface of the at least one LED chip, wherein the phosphor layer is in direct physical contact with the upper surface of the at least one LED chip, and
 at least a portion of the reflection layer is contacted with the phosphor layer.

2. The headlamp for a vehicle of claim 1, wherein the LED assembly further comprises an optical layer comprising a transparent material.

3. The headlamp for a vehicle of claim 2, wherein the optical layer comprises silicone.

4. The headlamp for a vehicle of claim 3, wherein the optical layer comprises a scattering particle.

5. The headlamp for a vehicle of claim 4, wherein the scattering particle comprises silicon dioxide ($SiO_2$).

6. The headlamp for a vehicle of claim 2, wherein the optical layer is disposed between the phosphor layer and the at least one LED chip.

7. The headlamp for a vehicle of claim 6, wherein the optical layer and the phosphor layer are films mounted on the at least one LED chip.

8. The headlamp for a vehicle of claim 1, wherein the reflection layer comprises a material selected from the group consisting of titanium dioxide ($TiO_2$), zirconium dioxide ($ZrO_2$), niobium pentoxide ($Nb_2O_5$), aluminum oxide ($Al_2O_3$), magnesium fluoride ($MgF_2$), aluminum nitride (AlN), and silicon dioxide ($SiO_2$).

9. The headlamp for a vehicle of claim 1, wherein the reflection layer has an upper surface which is coplanar with the phosphor layer.

10. The headlamp for a vehicle of claim 1, wherein the at least one LED chip has a lateral surface which is coplanar with the phosphor layer.

11. The headlamp for a vehicle of claim 1, wherein each of the at least one LED chip, the reflection layer, and the phosphor layer has a rectangular shape.

12. The headlamp for a vehicle of claim 1, wherein the LED assembly further comprises a substrate on which the at least one LED chip is mounted.

13. The headlamp for a vehicle of claim 12, wherein the at least one LED chip is entirely surrounded with the reflection layer, the phosphor layer, and the substrate.

* * * * *